(12) United States Patent
Farber et al.

(10) Patent No.: US 7,687,407 B2
(45) Date of Patent: Mar. 30, 2010

(54) METHOD FOR REDUCING LINE EDGE ROUGHNESS FOR CONDUCTIVE FEATURES

(75) Inventors: David G. Farber, Wylie, TX (US); Brian E. Goodllin, Dallas, TX (US); Robert Kraft, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 61 days.

(21) Appl. No.: 11/070,593

(22) Filed: Mar. 2, 2005

(65) Prior Publication Data

US 2006/0121739 A1 Jun. 8, 2006

Related U.S. Application Data

(60) Provisional application No. 60/632,407, filed on Dec. 2, 2004.

(51) Int. Cl.
*H01L 21/302* (2006.01)
(52) U.S. Cl. .................. 438/734; 216/39; 257/288
(58) Field of Classification Search .......... 438/734; 216/39; 257/288
See application file for complete search history.

(56) References Cited

U.S. PATENT DOCUMENTS

| | | | | |
|---|---|---|---|---|
| 4,560,436 A | * | 12/1985 | Bukhman et al. | 438/701 |
| 4,705,596 A | * | 11/1987 | Gimpelson et al. | 438/697 |
| 4,818,732 A | * | 4/1989 | Fox et al. | 501/81 |
| 5,354,386 A | * | 10/1994 | Cheung et al. | 148/33.3 |
| 5,605,600 A | * | 2/1997 | Muller et al. | 438/695 |
| 5,746,884 A | * | 5/1998 | Gupta et al. | 438/640 |
| 5,767,019 A | * | 6/1998 | Kim et al. | 438/696 |
| 6,156,640 A | * | 12/2000 | Tsai et al. | 438/636 |
| 6,159,862 A | * | 12/2000 | Yamada et al. | 438/712 |
| 6,368,959 B1 | * | 4/2002 | Nakamura | 438/640 |
| 6,562,714 B1 | * | 5/2003 | Lee | 438/637 |
| 2002/0182880 A1 | * | 12/2002 | Zhu et al. | 438/724 |
| 2004/0127016 A1 | * | 7/2004 | Hoog et al. | 438/637 |

OTHER PUBLICATIONS

U.S. Appl. No. 60/437,080, filed Dec. 2002, Hoog et al.*
dictionary.com; substrate; 2006.*
Namatsu et al.; Influence of Edge Roughness; Journal of Vacuum Science & Technology B: Microelectronics and Nanometer Structures—Nov. 1998—vol. 16, Issue 6, pp. 3315-3321.*

* cited by examiner

*Primary Examiner*—Binh X Tran
*Assistant Examiner*—Patricia A George
(74) *Attorney, Agent, or Firm*—Wade J. Brady, III; Frederick J. Telecky, Jr.

(57) ABSTRACT

The present invention provides an interconnect structure, a method of manufacture therefore, and a method for manufacturing an integrated circuit including the same. The method for forming the interconnect structure, among other steps, includes subjecting a first portion (510) of a substrate (220) to a first etch process, the first etch process designed to etch at a first entry angle ($\theta_1$), and subjecting a second portion (610) of the substrate (220) to a second different etch process, the second different etch process designed to etch at a second lesser entry angle ($\theta_2$).

17 Claims, 7 Drawing Sheets

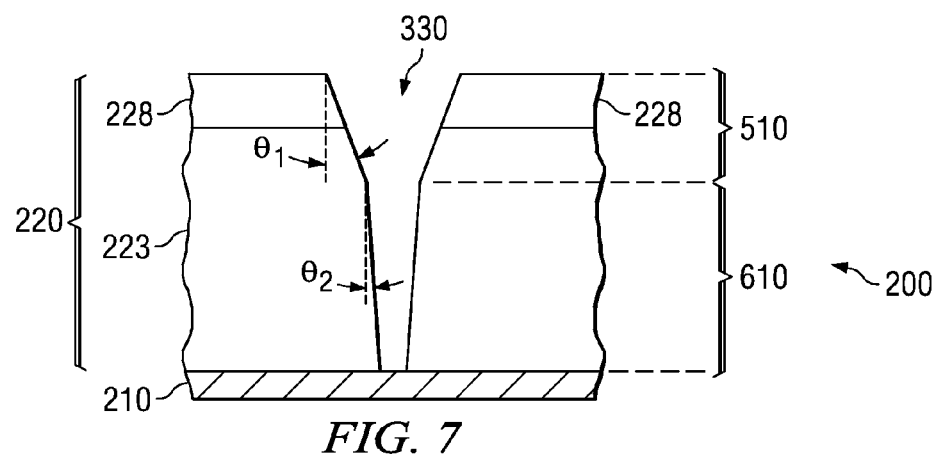
FIG. 7
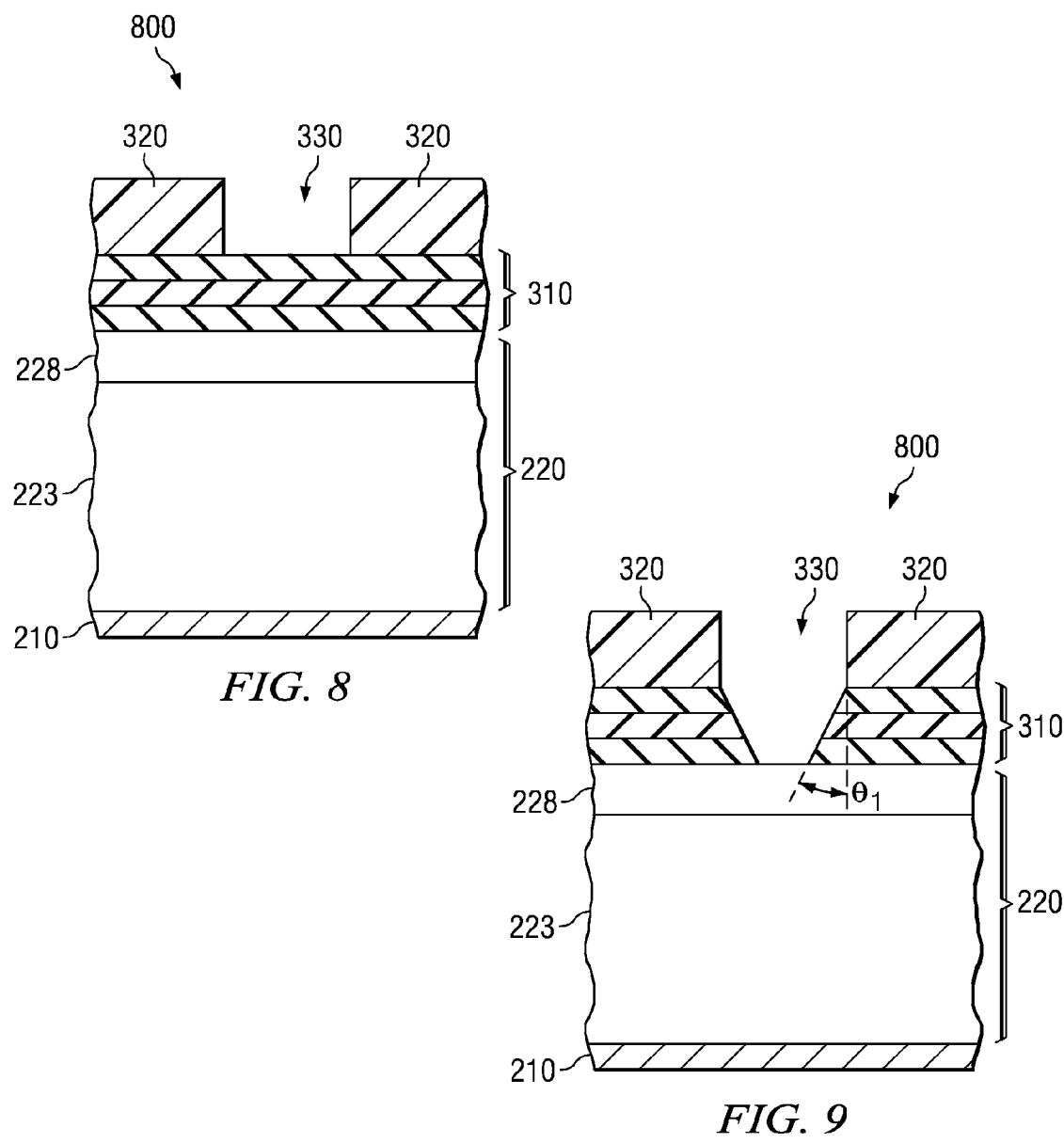
FIG. 8
FIG. 9

METHOD FOR REDUCING LINE EDGE ROUGHNESS FOR CONDUCTIVE FEATURES

CROSS REFERENCE TO PROVISIONAL APPLICATION

This application claims the benefit of U.S. Provisional Application No. 60/632,407 entitled "LINE EDGE ROUGHNESS REDUCTION AT THE 90 nm TECHNOLOGY NODE FOR CONTACT AND TRENCH ETCHED FEATURES," to David G. Farber, et al, filed on Dec. 2, 2004, which is commonly assigned with the present invention and incorporated herein by reference as if reproduced herein in its entirety.

TECHNICAL FIELD OF THE INVENTION

The present invention is directed, in general, to a method for forming openings in a substrate and, more specifically, to a method for reducing line edge roughness for conductive features in a substrate.

BACKGROUND OF THE INVENTION

Integrated circuits are mass-produced by fabricating hundreds of identical circuit patterns on a single semiconductor wafer. One of the many different processes repeated over and over in manufacturing these integrated circuits is that of using a mask and etchant for forming a particular feature. In such a mask and etching process, a photo mask containing the pattern of the structure to be fabricated is created. Then, after formation of a material layer within which the feature is to be formed, the material layer is coated with a light-sensitive material called photoresist or resist. The resist-coated material layer is then exposed to ultraviolet light through the mask and developed, thereby transferring the pattern from the mask to the resist. The wafer is then etched to remove the material layer unprotected by the resist, and then the remaining resist is stripped. This masking process permits specific areas of the material layer to be formed to meet the desired device design requirements.

The semiconductor industry has steadily reduced the dimensions of transistors in integrated circuits, resulting in increased transistor density and circuit functionality. As these dimensions are decreased from one manufacturing generation to the next, some processes may need to change to accommodate the smaller dimensions.

One important example is the photolithography process. When the dimensions of the transistor or the conductors connecting the transistors fall below the ability of the photolithography light source to resolve them, then the photolithography process must transition to a light source with a shorter wavelength. This transition will in general require a new photoresist, and may require a new anti-reflective coating (ARC) and dielectric layers under the ARC.

One property of a photoresist is the roughness of the edge of the features defined in it after exposure and development. This property is referred to herein as line edge roughness (LER). When a new photoresist is introduced, the LER may be significant. LER is determined in part by the chemistry of the photoresist, and may be reduced by photoresist manufacturers as the photoresist technology matures. However, maturation of a particular photoresist chemistry may be long compared to the design cycle of the industry, forcing manufacturers to go to production with a resist that has not yet been fully optimized with respect to LER.

Because the features to be etched into the semiconductor substrate are transferred from the photoresist, LER in the resist will transfer to LER of the completed feature. This is particularly a problem with conductive features, such as contacts and interconnects. Roughness in contact and interconnect openings is generally undesirable because it results in higher and less uniform resistance, as well as decreased reliability of the completed semiconductor device.

Accordingly, what is needed in the art is a photolithography process that does not experience the aforementioned drawbacks of the prior art.

SUMMARY OF THE INVENTION

To address the above-discussed deficiencies of the prior art, the present invention provides an interconnect structure, a method of manufacture therefore, and a method for manufacturing an integrated circuit including the same. The method for forming the interconnect structure, among other steps, includes subjecting a first portion of a substrate to a first etch process, the first etch process designed to etch at a first entry angle, and subjecting a second portion of the substrate to a second different etch process, the second different etch process designed to etch at a second lesser entry angle.

The method for manufacturing the integrated circuit, among others, includes: 1) forming transistor devices over a substrate, 2) placing a dielectric layer over the transistor devices, 3) forming openings in the dielectric layer, including, subjecting a first portion of a substrate to a first etch process, the first etch process designed to etch at a first entry angle, and subjecting a second portion of the substrate to a second different etch process, the second different etch process designed to etch at a second lesser entry angle, and 4) forming conductive plugs within the openings for contacting the transistor devices and forming an operational integrated circuit.

As previously mentioned, the present invention further provides an interconnect structure. The interconnect structure, without limitation, includes a dielectric layer having an opening formed therein located over a conductive feature, and a conductive plug located within the opening and contacting the conductive feature, wherein the conductive plug has a first region having a first entry angle and a second lower region having a second lesser entry angle.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which:

FIG. 7 illustrates a cross-sectional view of the partially completed interconnect structure illustrated in FIG. 6A after conventionally removing the photoresist layer and the intermediate layer;

FIGS. 8-11 illustrate cross-sectional views of an alternative embodiment of an interconnect structure at various different stages of manufacture, in accordance with the principles of the present invention.

DETAILED DESCRIPTION

Figure 1:
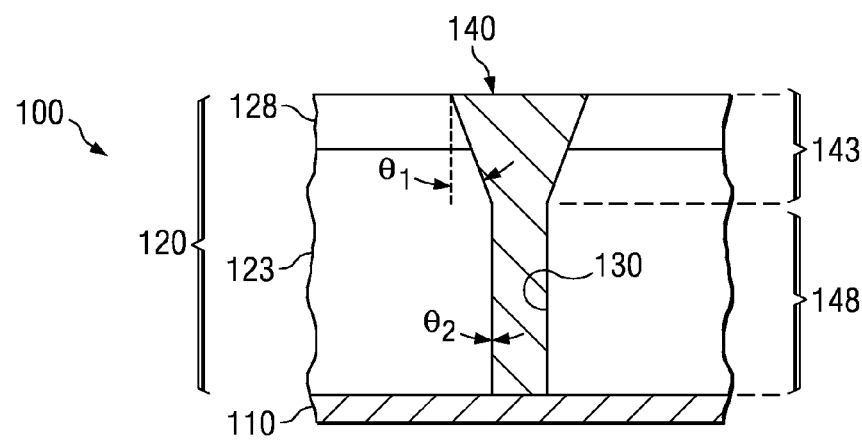
FIG. 1 illustrates a cross-sectional view of a semiconductor feature, such as an interconnect structure, which has been manufactured in accordance with the principles of the present invention.

Referring initially to FIG. 1, illustrated is a cross-sectional view of a semiconductor feature, such as an interconnect structure 100, which has been manufactured in accordance with the principles of the present invention. The interconnect structure 100 illustrated in FIG. 1 includes a conductive feature 110. The conductive feature 110 may comprise a number of different features while remaining within the scope of the present invention. In one aspect of the invention, the conductive feature 110 is a transistor device level feature, such as a gate electrode or source/drain contact region. In another aspect, however, the conductive feature 110 is a conductive trace or runner traversing along at least a portion of an inter-level dielectric layer. Other conductive features 110 may also exist.

Located over the conductive feature 110 is a substrate, such as a dielectric layer 120. Similar to the conductive feature 110, the dielectric layer 120 may comprise a variety of different configurations and materials without departing from the inventive aspects of the present invention. For instance, in the embodiment of FIG. 1, the dielectric layer 120 comprises a multi-layer dielectric layer, consisting of a first phosphosilicate glass (PSG) layer 123 and a second TEOS layer 128. Other embodiments nonetheless exist wherein the dielectric layer 120 only comprises a single layer of PSG or another common dielectric material. Accordingly, it goes without saying that the dielectric layer 120 may comprise a low dielectric constant (low-k) material, or another similar material, and stay within the purview of the present invention.

Located within an opening 130 in the dielectric layer 120 is a conductive plug 140. As is shown, the conductive plug 140 contacts the conductive feature 110. In accordance with the principles of the present invention, the conductive plug 140 comprises a first region 143 having a first entry angle ($\theta_1$) and a second region 148 having a second lesser entry angle ($\theta_2$). It should be noted from the outset, that for the purposes of the present invention, the first and second entry angles, $\theta_1$ and $\theta_2$, respectively, are taken from vertical, as shown in FIG. 1.

As will be further discussed below, the first entry angle (81) and the second lesser entry angle (82) allow a profile of an opening of second region 148 to be substantially smooth, thus having reduced line edge roughness (LER). It is believed that as long as the second entry angle ($\theta_2$) is lesser than the first entry angle ($\theta_1$), that some LER benefit should be achieved. Nevertheless, certain specific embodiments having certain specific first and second entry angles ($\theta_1$ and $\theta_2$) are believed to provide enhanced results. For instance, it is believed that exemplary results are obtained wherein the first entry angle ($\theta_1$) is greater than about 4 degrees, and even more advantageously when the first entry angle ($\theta_1$) is greater than about 10 degrees. Similar exemplary results may be achieved wherein the second entry angle ($\theta_2$) is about zero degrees.

Similar to the first and second entry angles ($\theta_1$ and $\theta_2$) providing enhanced results, and somewhat related thereto, it is often important to have the first region 143 be contained within an upper 30 percent of the conductive plug 140. In an even more exemplary embodiment, the first region 143 may be contained within an upper 20 percent of the conductive plug 140. It is believed that because the first region 143 is contained within an upper portion of the conductive plug 140, the etch used to form the second region 148 is longer and therefore has a better chance for reducing the LER.

Figure 2:
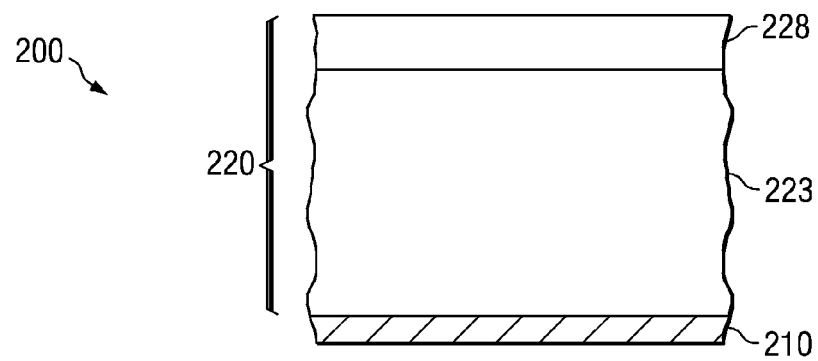
FIG. 2 illustrates a cross-sectional view of a partially completed interconnect structure.

Turning now to FIGS. 2-7, illustrated are cross-sectional views of an interconnect structure 200 at various different stages of manufacture, in accordance with the principles of the present invention. FIG. 2 illustrates a cross-sectional view of a partially completed interconnect structure 200. The interconnect structure 200 initially includes a dielectric layer 220 located over a conductive feature 210. As with the conductive feature 110 of FIG. 1, the conductive feature 210 may comprise a plurality of different shapes, materials, and placement without departing from the scope of the present invention. In the given embodiment of FIG. 2, however, the conductive feature 210 comprises a gate electrode or contact for a source/drain region.

The dielectric layer 220, similar to the dielectric layer 120, is conventional. Accordingly, it may comprise many different materials and layers, as well as collection of materials and collection of layers, and stay within the purview of the present invention. Nevertheless, the dielectric layer 220 of FIG. 2 comprises a first PSG layer 223 and a second TEOS layer 228.

Figure 3A:
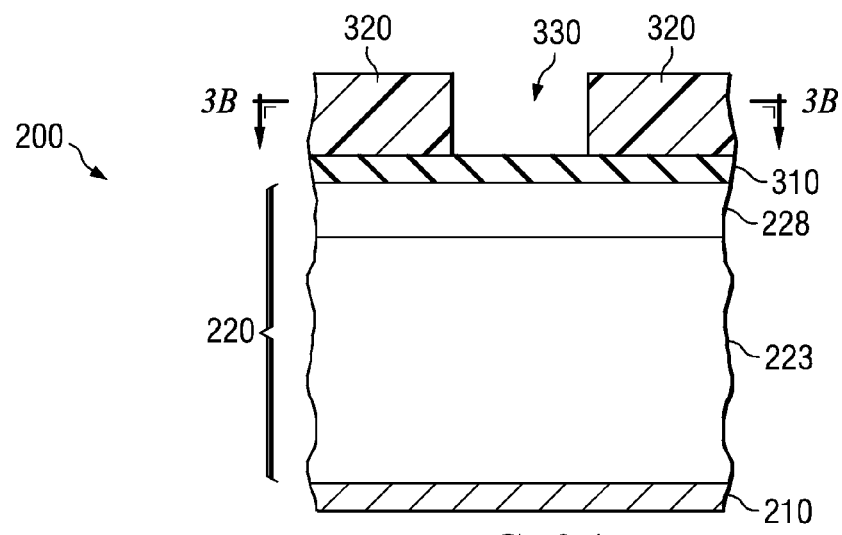
FIG. 3A illustrates a cross-sectional view of the partially completed interconnect structure illustrated in FIG. 2 after forming an intermediate layer over the dielectric layer, and forming and patterning a photoresist layer over the intermediate layer.

Turning now to FIG. 3A, illustrated is a cross-sectional view of the partially completed interconnect structure 200 illustrated in FIG. 2 after forming an intermediate layer 310 over the dielectric layer 220, and forming and patterning a photoresist layer 320 over the intermediate layer 310. The intermediate layer 310, among others and without limitation, may comprise an anti-reflective layer, such as a bottom anti-reflective coating (BARC) layer or a dielectric anti-reflective coating (DARC) layer. As will be discussed further later in this document, the intermediate layer 310 need not only comprise a single layer. Accordingly, multiple layer intermediate layers 310 may, and often will, be used.

As already briefly discussed, a photoresist layer 320 is located over the intermediate layer 310, the photoresist layer 320 having an opening 330 conventionally patterned therein. Those skilled in the art understand the process for forming and patterning the photoresist layer 320, thus no further detail is warranted.

The photoresist layer 320 may be any known or hereafter discovered photoresist layer 320 and stay within the scope of the present invention. Nevertheless, it is believed that certain newer types of photoresist benefit the most from using the inventive methodology of the present invention. For instance, it is believed that 193 nm wavelength or less photoresist layers benefit the most from using the inventive methodology of the present invention. Accordingly, while not limited to such, the present invention will be discussed with respect to a 193 nm wavelength photoresist layer.

Figure 3B:
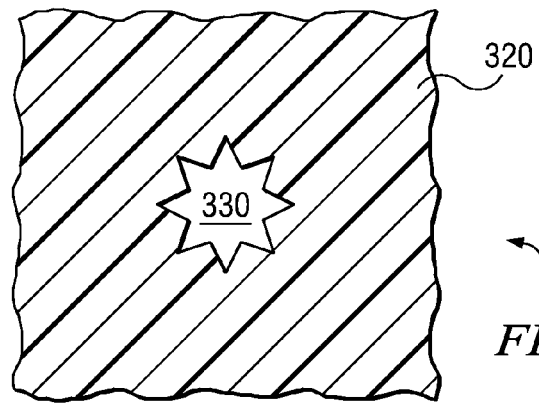
FIG. 3B illustrates a horizontal sectional view of the partially completed interconnect structure illustrated in FIG. 3A, taken through the section 3B-3B.

Turning now briefly to FIG. 3B, illustrated is a horizontal sectional view of the partially completed interconnect structure 200 illustrated in FIG. 3A, taken through the section 3B-3B. The horizontal sectional view of FIG. 3B illustrates that the opening 330 in the photoresist layer 320 may contain severe roughness, such as LER. This roughness, in ordinary circumstances apart from the unique aspects of the present invention, would typically be transferred to the resulting opening in the dielectric layer 220, often resulting in LER and complications caused by the LER.

Figure 4:
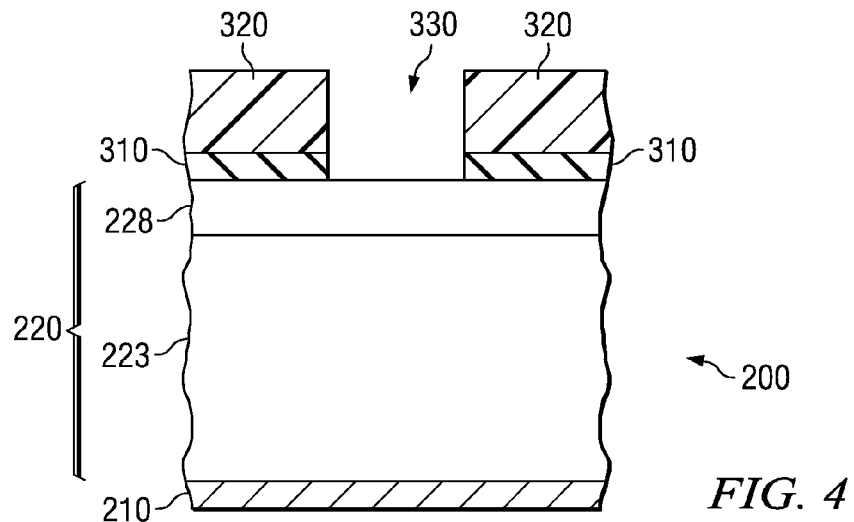
FIG. 4 illustrates a cross-sectional view of the partially completed interconnect structure illustrated in FIG. 3A after extending the opening through the intermediate layer.
Figure 10:
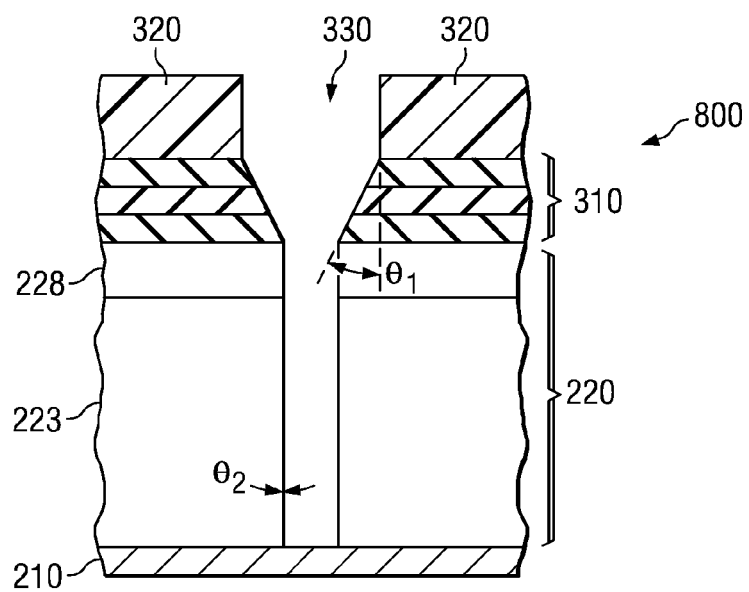
Figure 11:
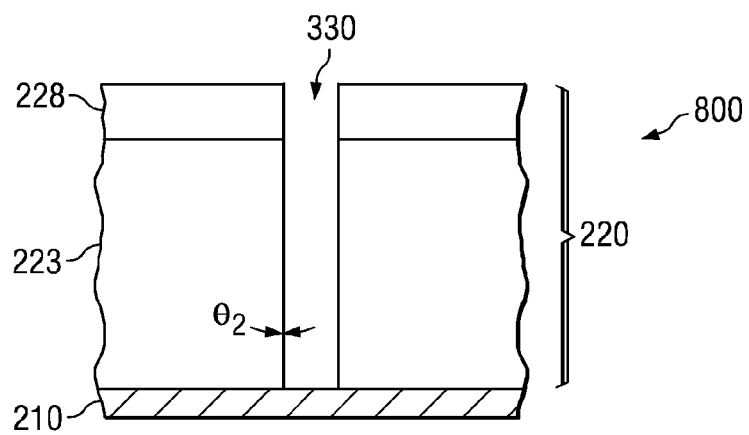

Turning now to FIG. 4, illustrated is a cross-sectional view of the partially completed interconnect structure 200 illustrated in FIG. 3A after extending the opening 330 through the intermediate layer 310. The opening 330 may be extended through the intermediate layer 310 using a number of different methods. In one embodiment, a standard etch is used to transfer the pattern of the opening 330 in the photoresist layer 320 unto the intermediate layer 310. In this embodiment the sidewalls of the opening 330 in the intermediate layer 310 may be substantially vertical. However, as discussed in more detail below, other embodiments exist wherein the opening 330 in the intermediate layer 310 has sloped sidewall angles. (FIGS. 9 and 10).

Figure 5A:
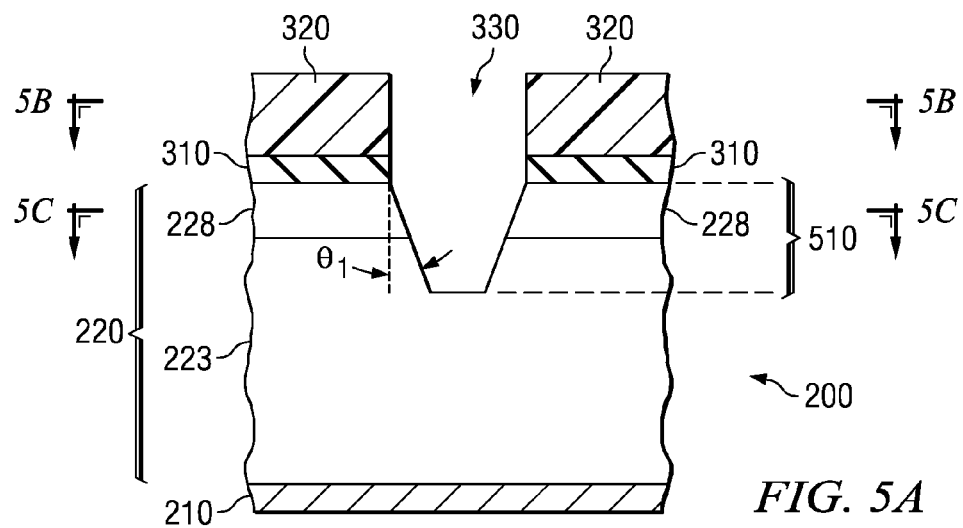
FIG. 5A illustrates a cross-sectional view of the partially completed interconnect structure illustrated in FIG. 4 after subjecting a first portion of a substrate, in this instance a first portion of the dielectric layer 220, to a first etch process.

Turning now to FIG. 5A, illustrated is a cross-sectional view of the partially completed interconnect structure 200 illustrated in FIG. 4 after subjecting a first portion 510 of a substrate, in this instance a first portion 510 of the dielectric layer 220, to a first etch process. As is illustrated, the specific parameters of the first etch process are tailored such that the first etch process etches at a first entry angle ($\theta_1$). For all purposes of the present invention, this first entry angle ($\theta_1$) must be greater than zero degrees. Nonetheless, in an exemplary embodiment, the first entry angle ($\theta_1$) is typically greater than about 4 degrees, and advantageously greater than about 10 degrees.

The specifics of the first etch process may vary greatly while achieving the aforementioned requirements. As an example, in one embodiment the first etch might use a polymer rich chemistry such as $C_5F_8$, Ar and $O_2$ mixture to achieve the desired angle ($\theta_1$). In another case, a less polymer rich chemistry could achieve a similar profile with lower RF power.

As is shown in FIG. 5A, the first etch process typically etches into the dielectric layer 220 a limited distances. For instance, in one exemplary embodiment of the present invention the first etch only etches into an upper 30 percent of the dielectric layer 220, and more particularly an upper 20 percent of the dielectric layer 220. It goes without saying, however, that the present invention is in no way limited to these percentages.

Figure 5B:
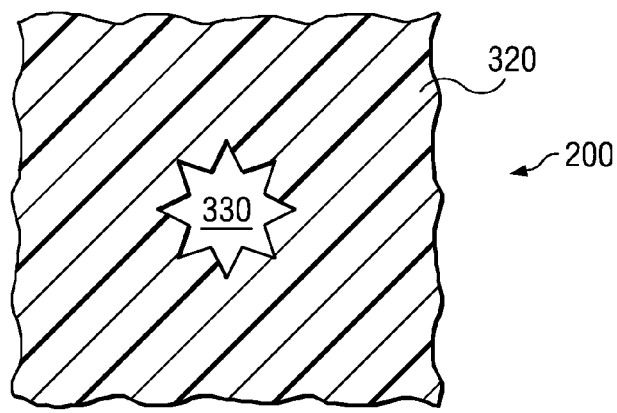
FIG. 5B illustrates a horizontal sectional view of the partially completed interconnect structure illustrated in FIG. 5A, taken through the section 5B-5B.

Turning now to FIG. 5B, illustrated is a horizontal sectional view of the partially completed interconnect structure 200 illustrated in FIG. 5A, taken through the section 5B-5B. Similar to the horizontal sectional view of FIG. 3B, the horizontal sectional view of FIG. 5B illustrates that the opening 330 in the photoresist layer 320 may still contain severe roughness. In many instances, this severe roughness remains even though the dielectric layer 220 has been subjected to the first etch through the photoresist layer 320.

Figure 5C:
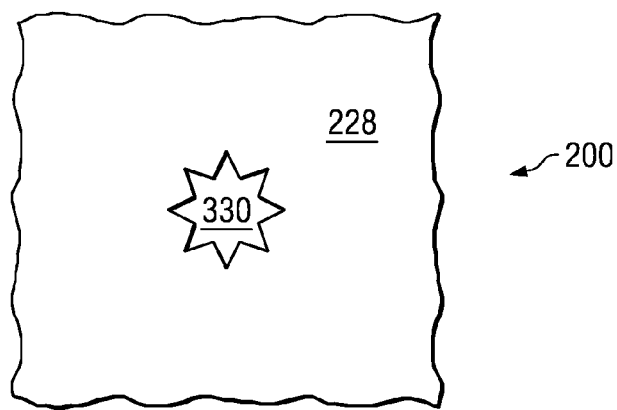
FIG. 5C illustrates a horizontal sectional view of the partially completed interconnect structure illustrated in FIG. 5A, taken through the section 5C-5C.

Turning now to FIG. 5C, illustrated is a horizontal sectional view of the partially completed interconnect structure 200 illustrated in FIG. 5A, taken through the section 5C-5C. Similar to the horizontal sectional view of FIG. 5B, the horizontal sectional view of FIG. 5C illustrates that the severe roughness in the photoresist layer 320 may be, and in this instance have been, substantially transferred unto the opening 330 in the first portion 510 of the dielectric layer 220 shown in FIG. 5A. In many instances, such as that shown, this severe roughness remains even though the dielectric layer 220 has been subjected to the first etch through the photoresist layer 320.

Figure 6A:
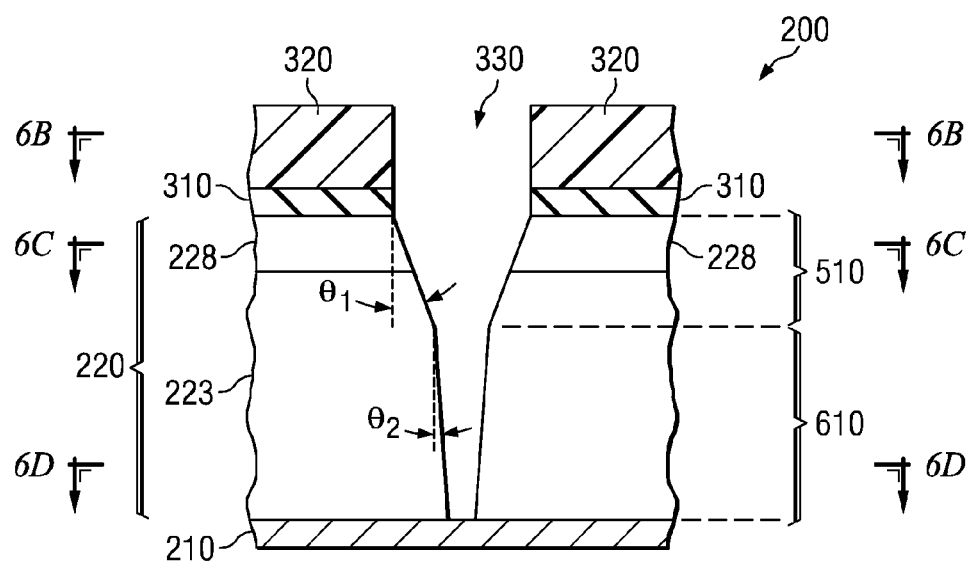
FIG. 6A illustrates a cross-sectional view of the partially completed interconnect structure illustrated in FIG. 5A after subjecting a second portion of a substrate, in this instance a second portion of the dielectric layer, to a second etch process.

Turning now to FIG. 6A, illustrated is a cross-sectional view of the partially completed interconnect structure 200 illustrated in FIG. 5A after subjecting a second portion of a substrate, in this instance a second portion of the dielectric layer 220, to a second etch process. As is illustrated, the specific parameters of the second etch process are tailored such that the second etch process etches at a second entry angle ($\theta_2$) that is less than the first entry angle ($\theta_1$). As compared to the first entry angle ($\theta_1$), the second entry angle ($\theta_2$) may, and often is, about zero degrees. However, other embodiments exist, such as the embodiment shown, wherein the second entry angle ($\theta_2$) is not zero. Of critical importance, however, is the fact that the second entry angle ($\theta_2$) is less than the first entry angle ($\theta_1$), and in the end achieves the proper critical dimension at the point where the opening 330 contacts the conductive feature 210.

The specifics of the second etch process may also vary greatly while achieving the aforementioned requirements. As an example, in one embodiment the second etch chemistry is similar to the first process in that $C_5F_8$, Ar and $O_2$ are used, however, CO and $Ch_2F_2$ may also be added to control and lessen the polymer deposition in order to achieve a lesser entry angle ($\theta_2$). In an exemplary embodiment the lesser entry angle ($\theta_2$) is near zero or zero.

As is shown in FIG. 6A, the second etch process typically etches into the dielectric layer 220 until it reaches the conductive feature 210. For instance, in one exemplary embodiment of the present invention wherein the first etch only etches into an upper portion of the dielectric layer 220, the second etch etches the remaining portion of the dielectric layer 220. It goes without saying, however, that the second etch might not etch entirely to the conductive feature 210 and that a subsequent etch or etches might be required to reach the conductive feature 210. Such an embodiment might occur when an etch stop layer (not shown) is located between the dielectric layer 220 and the conductive feature 210.

Figure 6B:
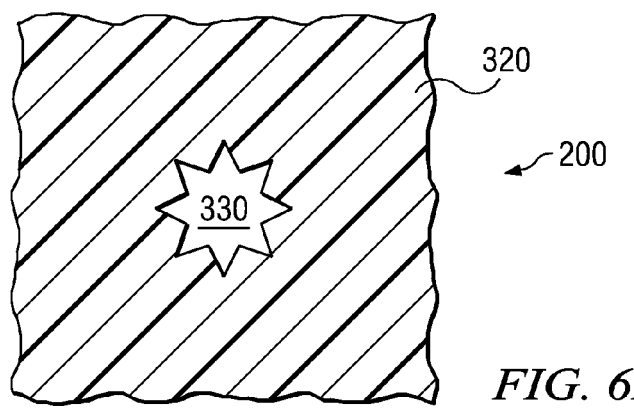
FIG. 6B illustrates a horizontal sectional view of the partially completed interconnect structure illustrated in FIG. 6A, taken through the section 6B-6B.

Turning now to FIG. 6B, illustrated is a horizontal sectional view of the partially completed interconnect structure 200 illustrated in FIG. 6A, taken through the section 6B-6B. The horizontal sectional view of FIG. 6B illustrates that the opening 330 in the photoresist layer 320 may still contain severe roughness. In many instances, this severe roughness remains even though the dielectric layer 220 has been subjected to the first and the second etches through the photoresist layer 320.

Figure 6C:
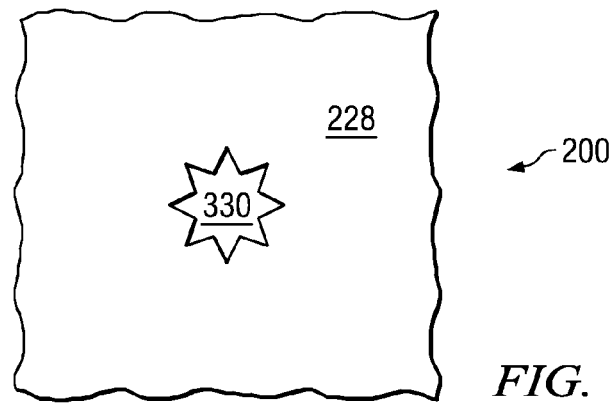
FIG. 6C illustrates a horizontal sectional view of the partially completed interconnect structure illustrated in FIG. 6A, taken through the section 6C-6C.

Turning now to FIG. 6C, illustrated is a horizontal sectional view of the partially completed interconnect structure 200 illustrated in FIG. 6A, taken through the section 6C-6C. Similar to the horizontal sectional view of FIG. 6B, the horizontal sectional view of FIG. 6C illustrates that the severe roughness still remains in the first portion of the opening 330 in the dielectric layer 220 shown in FIG. 5A.

Figure 6D:
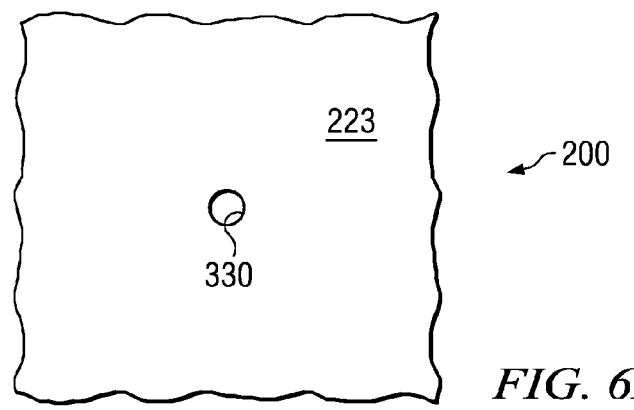
FIG. 6D illustrates a horizontal sectional view of the partially completed interconnect structure illustrated in FIG. 6A, taken through the section 6D-6D.

Turning however to FIG. 6D, illustrated is a horizontal sectional view of the partially completed interconnect structure 200 illustrated in FIG. 6A, taken through the section 6D-6D. The horizontal sectional view of FIG. 6C illustrates that the second portion of the opening 330 in the dielectric layer 220 does not contain the substantial amount of roughness that the photoresist layer 320 and the first portion contain. It is believed that the lesser entry angle of the second etch, and particularly the etch that provides the lesser entry angle, is capable of substantially reducing the degree of roughness in the second portion of the opening 330, as compared to the roughness in the first portion of the opening 330 and the photoresist layer 320 portion of the opening 330.

The horizontal sectional view illustrated in FIG. 6D illustrates that the opening is almost perfectly round, however, it need not be this perfect. In many instances the opening still contains a certain degree of roughness, however, that degree is reduced to an amount sufficient enough to alleviate the LER concerns.

Turning now to FIG. 7, illustrated is a cross-sectional view of the partially completed interconnect structure 200 illustrated in FIG. 6A after conventionally removing the photoresist layer 320 and the intermediate layer 310. While the photoresist layer 320 is being discussed as being removed at this stage of manufacture, certain embodiments exist wherein the photoresist layer 320 is removed subsequent to etching the intermediate layer 310, however, prior to etching the second portion of the dielectric layer 220. While it is unlikely, the same may also hold true for the intermediate layer 310. After achieving a device similar to that shown in FIG. 7, the process of manufacture would continue conventionally until a device similar to that shown in FIG. 1 was achieved.

Turning now to FIGS. 8-11, illustrated are cross-sectional views of an alternative embodiment of an interconnect structure 800 at various different stages of manufacture, in accordance with the principles of the present invention. The partially completed interconnect structure 800 illustrated in FIGS. 8-11 is substantially similar to the partially completed interconnect structure 200 illustrated in FIGS. 2-7, with the exception that the intermediate layer 310 of FIGS. 8-11 is a multilayer intermediate layer 310. Further, as a result of the multilayer intermediate layer 310, the first etch having the first entry angle ($\theta_1$) etches into the multilayer intermediate layer 310, and the second etch having the second entry angle ($\theta_2$) etches into the dielectric layer 220. In this embodiment, the substrate upon which the etches are being subjected, includes both the intermediate layer 310 and the dielectric layer 220. In another alternative embodiment, not shown, the first etch having the first entry angle ($\theta_1$) etches through the multilayer intermediate layer 310 and partially into the dielectric layer 220, and the second etch having the second entry angle ($\theta_2$) etches further into the dielectric layer 220, if not entirely through the dielectric layer 220. What results, after removing the photoresist layer 320 and the multilayer intermediate layer 310 in FIG. 10, is a device similar to that shown in FIG. 11.

The use of the methodology of the present invention provides a number of advantages over the prior art. For example, advantageous to the present invention, whether using the method of FIGS. 2-7, that of FIGS. 8-11, or another method covered by the present invention, is the ability to achieve reduced LER when the target CD is smaller than the print (e.g., photoresist) CD. This was previously not attainable for situations wherein the target CD is smaller than the print CD, especially for 193 nm wavelength of less photoresist materials.

Figure 12:
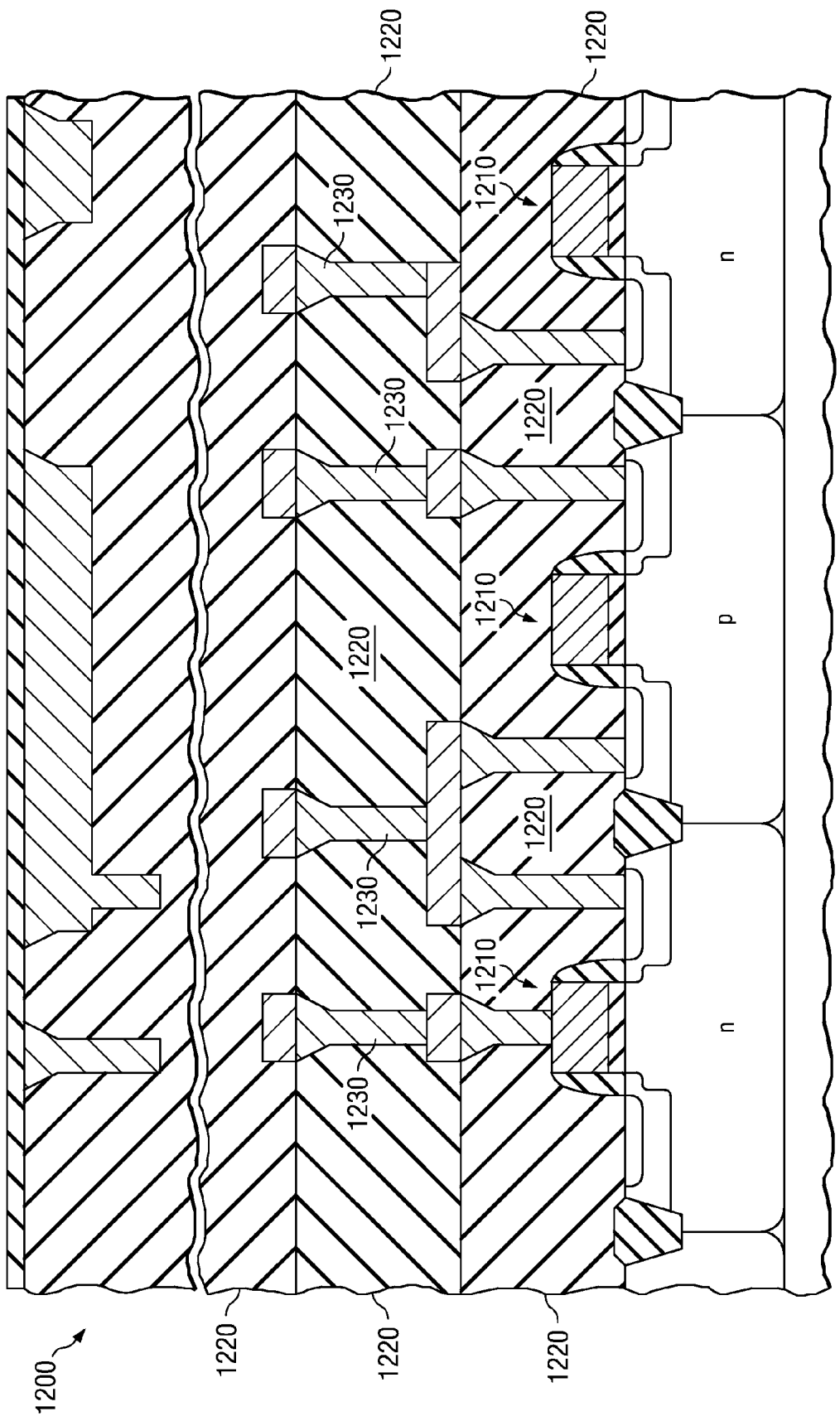
FIG. 12 illustrates a cross-sectional view of an integrated circuit manufactured according to the principles of the present invention.

Referring now to FIG. 12, illustrated is an exemplary cross-sectional view of an integrated circuit (IC) 1200 incorporating interconnect structures 1230 constructed according to the principles of the present invention. The IC 1200 may include devices, such as transistors used to form CMOS devices, BiCMOS devices, Bipolar devices, as well as capacitors or other types of devices. The IC 1200 may further include passive devices, such as inductors or resistors, or it may also include optical devices or optoelectronic devices. Those skilled in the art are familiar with these various types of devices and their manufacture. In the particular embodiment illustrated in FIG. 12, the IC 1200 includes transistor devices 1210 having dielectric layers 1220 located thereover. Additionally, interconnect structures 1230 are located within the dielectric layers 1220 to interconnect various devices, thus, forming the operational integrated circuit 1200.

Although the present invention has been described in detail, those skilled in the art should understand that they can make various changes, substitutions and alterations herein without departing from the spirit and scope of the invention in its broadest form.

What is claimed is:

1. A method for forming an interconnect structure having reduced line edge roughness, comprising:

providing a substrate having a major surface;

patterning a photoresist layer over the substrate to form a first opening that exposes an area of the major surface, the first opening having a first width dimension parallel to the major surface;

subjecting a first portion of the substrate adjacent to the first opening to a first etch process having a first angle, wherein the first angle is constant and greater than about 10 degrees, relative to a line perpendicular to the major surface, throughout the entire first etch process, the angle of the first etch process forming a hole with tapered sidewalls in the substrate, the hole having a second width dimension that is both parallel to, and smaller than, the first width dimension; and after the first etch process, subjecting a second portion of the substrate to a second different etch process to extend the depth of the hole to a conductive feature in the substrate, the second different etch process designed to etch at a second angle from the line perpendicular to the major surface, forming a second opening, the second angle being less than the first angle and constant throughout the entire second different etch process, the second portion being adjacent to the first portion, wherein a second degree of line edge roughness of the opening of the hole in the second portion of the substrate is reduced as compared to a first degree of line edge roughness of the opening of the hole in the first portion.

2. The method as recited in claim 1 wherein the photoresist layer is a 193 nm wavelength or less photoresist layer.

3. The method as recited in claim 1 wherein the substrate is a dielectric layer, and the first etch etches into a first portion of the dielectric layer and the second etch etches into a second portion of the dielectric layer.

4. The method as recited in claim 1 wherein the substrate is a multilayer substrate, the first portion being one or more antireflective coating layers and the second portion being a dielectric layer.

5. The method as recited in claim 1 further including filling an opening created by the first or second etch process with a conductive plug.

6. The method as recited in claim 5 wherein the conductive plug is an electrical contact for a transistor level device feature.

7. The method as recited in claim 1 wherein the second angle is about zero degrees.

8. The method of claim 1, wherein the first etch employs a gas mixture comprising $C_5F_8$, Ar and $O_2$.

9. The method of claim 8, wherein the second etch employs a gas mixture comprising $C_5F_8$, Ar, $O_2$, CO and $CH_2F_2$.

10. The method of claim 1, wherein the first portion of the substrate subjected to the first etch process is a multilayer intermediate layer and the second portion of the substrate is a dielectric layer, the method further comprising removing the photoresist and the multilayer intermediate layer following the second etch process.

11. An interconnect structure, comprising:
 a dielectric layer having two openings formed therein located over a conductive feature, the dielectric having a major surface; and
 a conductive plug located within the openings and contacting the conductive feature, wherein the conductive plug has a first region having a first degree of fine edge roughness within the first opening, and a first angle greater than about 10 degrees, the first angle being constant throughout the first region, and a second lower region having a second degree of line edge roughness within the first opening, and a second angle that is about zero degrees, the second angle being constant throughout the second lower region, the first region extending from the major surface of the dielectric to the second region, the second lower region extending to the conductive feature; and
 wherein the first and second angles are relative to a line perpendicular to the major surface, and the second degree of line edge roughness is reduced compared to the first degree of line edge roughness.

12. The interconnect structure as recited in claim 11 wherein the first region is located within an upper 30 percent of the conductive plug.

13. The interconnect structure as recited in claim 11 wherein the conductive plug is a contact for contacting a transistor device level feature.

14. A method for manufacturing an integrated circuit, comprising:
 providing a substrate having a major surface;
 forming transistor devices over the substrate;
 placing a dielectric layer over the transistor devices;
 forming a patterned photoresist layer over the dielectric layer, the patterned photoresist layer being a 193 nm wavelength or less photoresist layer;
 forming openings in the dielectric layer using the photoresist layer as a mask, each of the openings having a corresponding first width dimension parallel to the major surface, including:
 subjecting a first portion of the dielectric layer adjacent to the openings to a first etch process having a first angle to form holes each having a second width dimension that is both parallel to, and smaller than, the first width dimension, wherein the first angle is greater than about 10 degrees, relative to a line perpendicular to the major surface, the first angle being constant throughout the entire first etch process; and
 after the first etch process, subjecting a second portion of the dielectric layer to a second different etch process to extend the holes to one or more conductive features in the substrate, the second different etch process designed to etch at a second angle of about zero degrees from the line perpendicular to the major surface, forming a second opening, wherein the second angle is constant throughout the entire second different etch process, and the second portion is adjacent to the first portion, wherein a second degree of line edge roughness of the opening of the holes in the second portion of the substrate is reduced as compared to a first degree of the line edge roughness of the opening of the holes in the first portion; and
 forming conductive plugs within the openings for contacting the transistor devices and forming an operational integrated circuit.

15. The method of claim 14, wherein the first etch process etches the first angle within an upper 30 percent of the conductive plugs.

16. The method of claim 15, wherein the first etch employs a gas mixture comprising $C_5F_8$, Ar and $O_2$.

17. The method of claim 16, wherein the second etch employs a gas mixture comprising $C_5F_8$, Ar, $O_2$, CO and $CH_2F_2$.

* * * * *